United States Patent
Schulz et al.

(10) Patent No.: US 6,933,723 B2
(45) Date of Patent: Aug. 23, 2005

(54) COIL SYSTEM FOR AN MR APPARATUS AND AN MR APPARATUS PROVIDED WITH SUCH A COIL SYSTEM

(75) Inventors: Volkmar Schulz, Hamburg (DE); Bernhard Gleich, Hamburg (DE); Jürgen Weizenecker, Norderstedt (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 37 days.

(21) Appl. No.: 10/502,263

(22) PCT Filed: Jan. 15, 2003

(86) PCT No.: PCT/IB03/00086

§ 371 (c)(1),
(2), (4) Date: Jul. 22, 2004

(87) PCT Pub. No.: WO03/062846

PCT Pub. Date: Jul. 31, 2003

(65) Prior Publication Data

US 2005/0083057 A1 Apr. 21, 2005

(30) Foreign Application Priority Data

Jan. 26, 2002 (DE) .......................... 102 02 986

(51) Int. Cl.⁷ ................................. G01V 3/00
(52) U.S. Cl. ..................... 324/318; 335/299
(58) Field of Search ............. 335/216, 296–306; 324/318–320

(56) References Cited

U.S. PATENT DOCUMENTS 5,512,828 A * 4/1996 Pausch et al. ............... 324/309
6,154,110 A  11/2000 Takeshima
6,462,636 B1 * 10/2002 Overweg et al. ........... 335/299

FOREIGN PATENT DOCUMENTS

EP  0 304 126 A1  2/1989
EP  0 307 981 A1  3/1989

* cited by examiner

Primary Examiner—Ramon M. Barrera
(74) Attorney, Agent, or Firm—Thomas M. Lundin

(57) ABSTRACT

A coil system (210) for an apparatus operating in conformity with the spin resonance or magnetic resonance (MR) method encloses an examination space (217) which extends along an axis (218) and is intended to receive a patient (215). It includes an inner RF coil (219), an inner sub-coil (213') which externally encloses the RF coil (219) and projects beyond the RF coil (219) in the axial direction at both sides, and an active shield (212) which externally encloses the inner sub-coil (213') and constitutes a gradient coil arrangement in conjunction with the inner sub-coil (213'). For specified gradients, the energy required for the gradient coil arrangement (213', 212) in such a coil system is reduced in that the volume occupied by the inner sub-coil (213') is extended in the axial direction by way of regions extending beyond the RF coil (219) in the direction of the axis (218). It is an essential aspect that generally three gradient coils are accommodated in the volume enclosed by the gradient coil arrangement (213', 212). This layered arrangement produces three mutually perpendicular gradient fields as usual. However, it is not necessary to calculate these fields to be such that they extend perpendicularly to one another. All three coil arrangements per se require a smaller energy component in comparison with the normal case.

6 Claims, 2 Drawing Sheets

Figure 1:
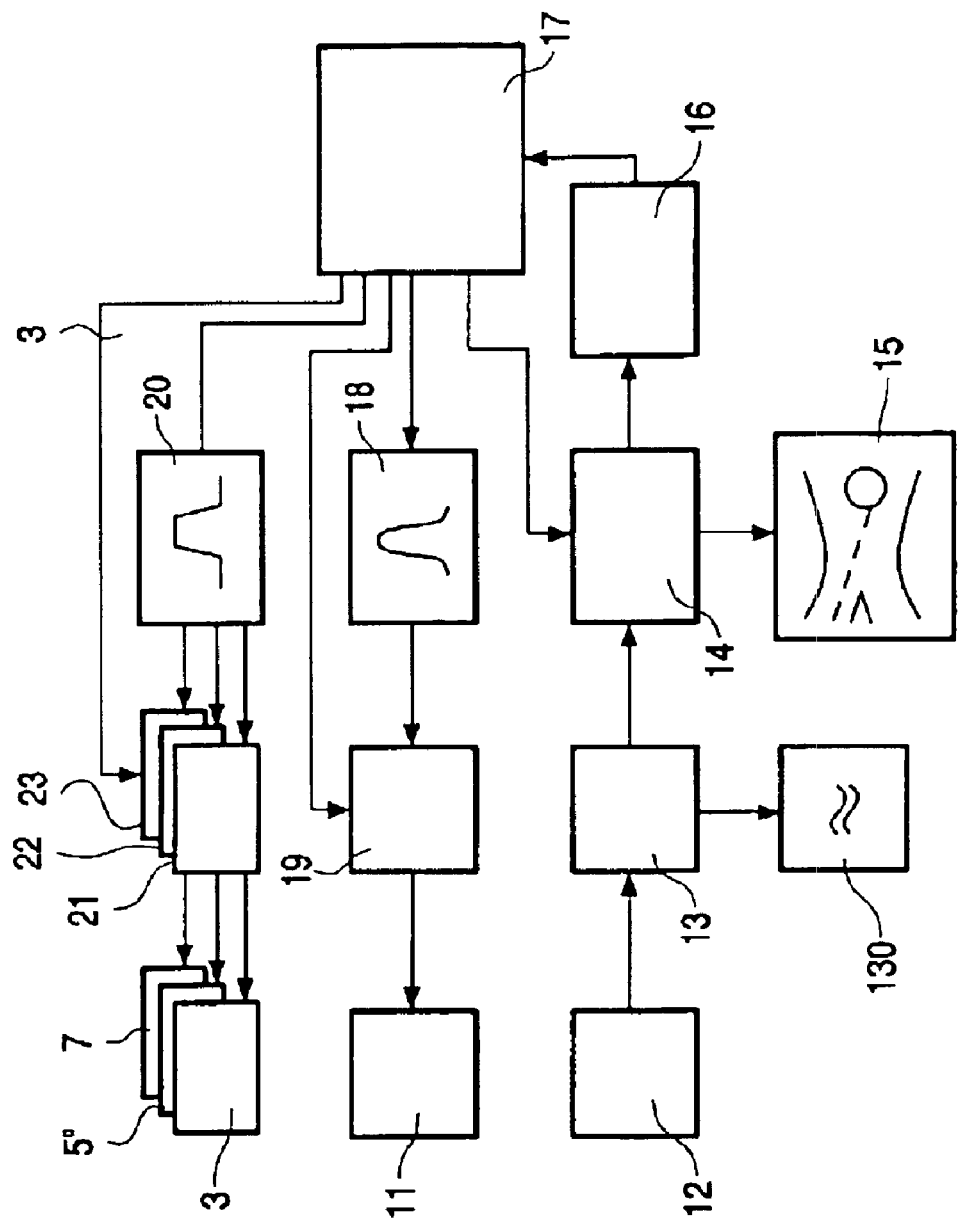

COIL SYSTEM FOR AN MR APPARATUS AND AN MR APPARATUS PROVIDED WITH SUCH A COIL SYSTEM

The present invention relates to the field of magnetic resonance tomography. More specifically, it relates to a coil system as disclosed in the introductory part of claim 1. It also relates to an MR apparatus which includes a coil system of this kind.

A coil system of the kind set forth is known, for example, from EP-A1-0 304 126.

Magnetic Resonance Imaging (MRI) methods, utilizing the interaction between magnetic fields and nuclear spins in order to form two-dimensional or three-dimensional images, are being used for numerous applications notably in the field of medical diagnostics, because in many respects they are superior to other imaging methods for the imaging of soft tissue structures, do not require ionizing radiation and usually are not invasive.

According to the MRI method, the body to be examined is introduced into a strong, uniform magnetic field whose direction defines at the same time an axis (normally the z axis) of the co-ordinate system on which the measurement is based. The magnetic field produces different energetic levels for the individual nuclear spins, that is, in dependence on the magnetic field strength, which can be excited (spin resonance) by application of an electromagnetic alternating field having a defined frequency (Larmor frequency). From a macroscopic point of view, the distribution of the individual nuclear spins gives rise to an overall magnetization which, under the influence of an applied electromagnetic pulse of suitable frequency (RF pulse) during which the magnetic field extends perpendicularly to the z axis, can be deflected, along a spiral-shaped track, out of the state of equilibrium so that it performs a precessional motion around the z axis. The precessional motion describes a surface of cone whose angle of aperture is referred to as a flip angle. The value of the flip angle is dependent on the strength and the duration of the applied electromagnetic pulse. In the case of a so-called 90° pulse, the spins are deflected from the z axis into the transverse plane (flip angle 90°).

After the end of the RF pulse, the magnetization relaxes again to the original state of equilibrium, the magnetization then being built up again in the z direction with a first time constant $T_1$ (spin lattice relaxation time) while the magnetization in the direction perpendicular to the z direction decays with a second time constant $T_2$ (spin spin relaxation time). The variation of the magnetization can be detected by means of a coil which is usually oriented in such a manner that the variation of the magnetization is measured in the direction perpendicular to the z axis (transverse magnetization, time constant $T_2$). The decay of the transverse magnetization is accompanied, after application of a 90° pulse, by a transition, caused by local magnetic field inhomogeneities, of the nuclear spins from an ordered state of the same phase to a state of equilibrium in which all phase angles are equally distributed (dephasing). The dephasing can be compensated by a refocusing pulse (180° pulse). An echo signal (spin echo) arises in the detection coil as a result.

In order to achieve a spatial resolution in the body, linear gradient fields in the three main axes are superposed on the uniform magnetic field by means of a gradient coil arrangement comprising three gradient coil systems, thus leading to a linear spatial dependency of the spin resonance frequency. The signal detected in the detection coil then contains components of different frequency which can be associated, after a Fourier transformation from the time axis to the frequency axis, with different positions within the body.

The coil system of an MR apparatus comprises not only a coil arrangement for generating a uniform stationary field, but also coil arrangements for generating the gradient fields as well as a coil arrangement for generating a (pulsed) RF field. An example of such a coil system is shown in the FIGS. 9 and 10 of U.S. Pat. No. 6,154,110. A gradient coil arrangement for generating the gradient fields is arranged coaxially within a superconducting main coil, said gradient coil arrangement consisting of an (outer) shielding coil and an (inner) sub-coil. As appears from FIG. 2, the present invention is based on a similar known coil system: the known coil system 210 is oriented along an axis 218 and encloses an examination space 217 in which a patient 215 to be examined can be introduced by means of a patient table 216 which is displaceable in the axial direction and is positioned at the lower side of the examination zone 217. The coil system 210, enclosing the examination space 217, comprises (looking from the inside towards the periphery) an RF coil 219, an actively shielded gradient coil arrangement, consisting of an inner sub-coil 213 (which is denoted by dotted lines in FIG. 2 so as to be distinct from the inner sub-coil 213' in accordance with the invention) and an actively shielding coil or shield 212, and a cryostat 211 in which the coil for generating the uniform, steady magnetic field is accommodated. The gradient coil arrangement 213, 212 is controlled by a gradient amplifier 220.

Gradient amplifiers of this kind represent are among the most expensive components of a contemporary MR apparatus. Therefore, it is desirable to provide the MR apparatus with coils requiring an as small as possible amount of energy. In order to reduce the amount of energy required for the gradient coils, the cited EP-A1-0 304 126 proposes the use of special compensation coils which attenuate or suppress the undesirable stray fields and eddy currents of the gradient coils.

Furthermore, in order to reduce the energy required for the gradient coils and the RF coil the document EP-A1-0 307 981 proposes the use of a combined RF and gradient coil system which enables a reduction of the free inner diameter of the coil system.

In both cases the adaptation of the coil system so as to achieve a reduced energy consumption for the gradient coils is comparatively intricate and complex.

Therefore, it is an object of the invention to provide a coil system as well as an MR apparatus provided with such a coil system which are characterized by a geometry which in a simple manner has been optimized in respect of energy consumption.

The object is achieved as disclosed in the characterizing part of the claims 1 and 6, respectively.

According to the invention it is assumed that for the field energy available in the gradient field it is advantageous when an as large as possible volume is present between the inner sub-coil and its active shielding, that is, without at the same time reducing the volume for the RF coil and without reducing the examination space for the patient to be examined. The basic idea of the invention is to utilize for the inner sub-coil the unused space situated outside the inner RF coil and inside the cover.

To this end, a coil system of the described kind is proposed which is configured in accordance with the invention in such a manner that, in order to reduce the energy required for the gradient coil system, the volume occupied by the inner sub-coil is expanded towards the axis in the regions extending beyond the RF coil in the axial direction.

This embodiment in conformity with claim 2 offers the advantage that the space available underneath the table top of the patient table is optimally used for the sub-coil.

A further preferred embodiment of the invention as disclosed in claim 3 is characterized in that more volume is now available to the sub-coil, without the openness of the examination space being affected at either side.

Further advantageous embodiments are disclosed in the dependent claims.

In accordance with the invention, the coil system in accordance with the invention is employed in an imaging MR apparatus.

Further embodiments are disclosed in the dependent claims.

An MR apparatus which includes a coil system for generating a uniform, steady magnetic field, whose strength defines the Larmor frequency, and for generating RF pulses and for receiving the MR signals generated by an object to be examined, is constructed in accordance with the invention in such a manner that a coil system for an apparatus which operates in conformity with the spin resonance or magnetic resonance method, which coil system encloses an examination space which extends along an axis and is intended to receive a patient, and includes an inner RF coil, an inner sub-coil which externally encloses the RF coil and projects beyond the RF Coil in the axial direction at both sides, and an active shield which externally encloses the inner sub-coil, is provided in such a manner that, in order to reduce the energy required for the gradient coil system, the volume occupied by the inner sub-coil is expanded in the direction of the axis in the regions extending beyond the RF coil in the axial direction.

Figure 2:
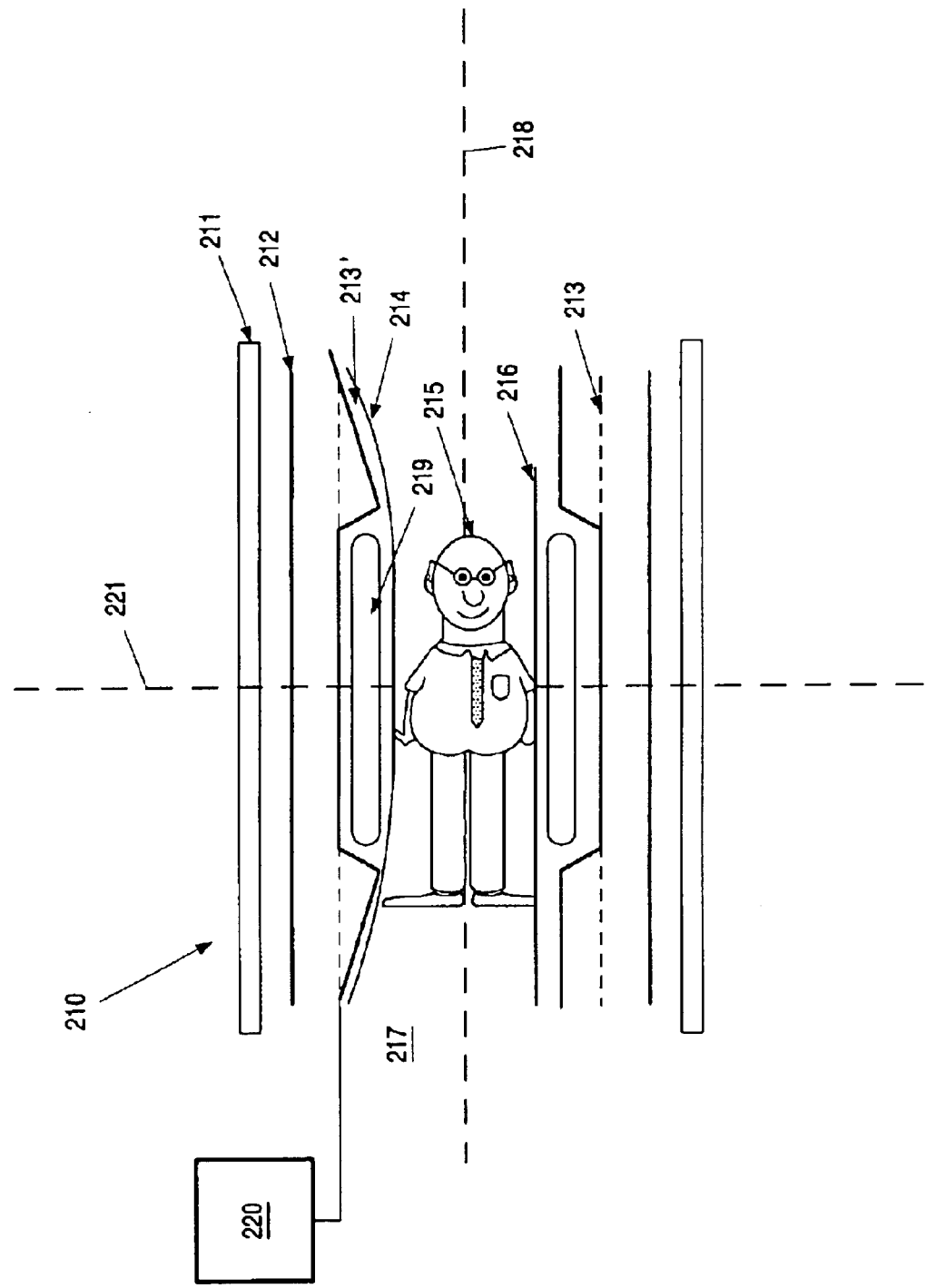

The invention will be described in detail hereinafter on the basis of embodiments and with reference to the accompanying drawing. Therein:

FIG. 1 shows a circuit diagram of an MR apparatus in which the coil system in accordance with the invention can be used, and FIG. 2 is a single diagrammatic representation in the form of a longitudinal sectional view of a coil system in conformity with the present state of the art (inner sub-coil denoted by dotted lines) as well as of an embodiment of a coil system in accordance with the invention (inner coil denoted by solid lines).

FIG. 1 shows the circuit diagram of an MR apparatus which is suitable for employing the coil system in accordance with the invention. It includes a control unit 17 which controls a gradient waveform generator 20; a first, a second and a third gradient amplifier, 21, 22, 23, respectively, are connected to the outputs of the generator 20. Each of these amplifiers produces a respective current for a first, a second and a third gradient coil 3, 5, 7, respectively. The gain factors of these amplifiers can be adjusted independently of one another by the control unit 17, that is, via leads 32, so that the gradient coils 3, 5, 7 generate the gradient fields in the x, y and z directions and slice selection can be performed in the corresponding three spatial directions in the region being examined.

Furthermore, the control unit 17 controls an RF generator 18 in order to adjust the frequency of the RF pulses to the Larmor frequencies, which are dependent on the gradient fields, for the MR imaging. The RF pulses are applied to an amplifier 19 whose gain is controlled by the control unit 17 and are subsequently applied to an RF transmitter coil 11.

The MR signals induced in an RF receiving coil 12 because of the relaxation of the excited magnetization states are demodulated in a quadrature demodulator 13 by mixing with two carrier oscillations which are 90° offset relative to one another, have a Larmor or MR frequency which is determined by the local strength of the steady magnetic fields, and originate from an oscillator 130, thus giving rise to two signals which may be considered as the real component and the imaginary component of a complex signal. These signals are applied to an analog-to-digital converter 14. Finally, the MR images are reconstructed in known manner by means of an image processing unit 16 so as to be displayed on a monitor 15.

In the embodiment of a coil system as shown in FIG. 2, being suitable for incorporation in the MR apparatus as shown in FIG. 1, the inner coil 213 which is denoted by dotted lines and forms part of the gradient coil system in conformity with the present state of the art which consists of an inner sub-coil 213 and an active shield 212, is replaced by the inner sub-coil 213' which is denoted by solid lines. The novel inner sub-coil 213' utilizes volumes which have not been used thus far. Such unused volumes are situated underneath the patient table 216 and above a cover 214 which separates the coil system 210 from the examination room 217 in the regions which are situated outside the RF coil 219 in the axial direction. In these regions the inner boundary of the inner subcoil 213' is shifted towards the axis 218, so that it extends parallel to the axis 218 at the lower side and parallel to the cover 214 at the upper side. The coil system 210 and notably the inner sub-coil 213' are arranged so as to be symmetrical relative to a central plane 221, so that the field conditions are simplified. The mode of operation and the configuration of the RF coil 219 in FIG. 2 correspond to those of the RF coil 11 in FIG. 1 and the components 213' in conjunction with the shield 212 in FIG. 2 correspond to the gradient coils 3, 5 or 7 in FIG. 1.

In the regions which extend beyond the RF coil 219 in the axial direction the distance between the inner sub-coil 213' and the axis 218 is larger than or equal to the distance between the RF coil 219 and the axis 218, so that the examination space 217 available to the patient 215 is determined exclusively by the RF coil and is not reduced because of the novel inner sub-coil 213'.

The distribution of turns of the gradient coil system or the gradient coil arrangement can be calculated by means of a numerical method (S. Pissanetzky Meas. Sci. Technol. 3 (1992), p. 667 ff.). A reduction of the coil energy by approximately 35% is thus achieved in comparison with a conventional standard system.

Overall, the invention provides a coil system which is characterized by the following features and advantages:

a lower energy consumption is obtained, thus reducing the costs of the gradient amplifiers, a higher gradient can be generated without modifying the gradient amplifier. Moreover, the examination space available to the patient is not reduced.

LIST OF REFERENCES
3, 5, 7 gradient coils
11 RF transmitter coil
12 RF receiver coil
13 quadrature demodulator
14 analog-to-digital converter
15 monitor
16 image processing unit
17 control unit
18 RF generator
19 amplifier
20 gradient waveform generator
21, 22, 23 gradient amplifiers
210 coil system
211 cryostat
212 active shield
213, 213' inner sub-coil 214 cover
215 patient
216 patient table
217 examination space
218 z axis (direction of the steady magnetic field)
219 RF coil
220 gradient amplifier
221 symmetry plane

What is claimed is:

1. A coil system (210) for an apparatus which operating in conformity with the spin resonance or magnetic resonance (MR) method, which coil system (210) encloses an examination space (217), which extends along an axis (218) and is intended to receive a patient (215), and includes an inner RF coil (219), an inner sub-coil (213') which externally encloses the RF coil (219) and projects beyond the RF coil (219) in the axial direction at both sides, and an active shield (212) which externally encloses the inner sub-coil (213') and constitutes a gradient coil arrangement in conjunction with the inner sub-coil (213'), characterized in that, in order to reduce the energy required for the gradient coil system (213', 212), the volume which is present between the inner sub-coil (213') and the active shield (212) is enlarged in that the cross-section of the inner sub-coil (213') in the direction perpendicular to the axis (218) is smaller in regions to both sides of the RF coil (219) than in the region of the RF coil.

2. A coil system as claimed in claim 1, characterized in that, in order to introduce a patient (215) into the examination space (217), at the lower side of the examination space (217) there is provided a patient table (216) which is displaceable along the axis (218) and that the inner boundary of the inner sub-coil (213') extends preferably parallel to the axis (218) in the regions extending beyond the RF coil (219) in the axial directions.

3. A coil system as claimed in claim 2, characterized in that at the upper side of the examination space (217) the coil system is separated from the examination space (217) by a cover (214) which opens towards the outside in the regions extending beyond the RF coil (219) in the axial direction, and that the inner boundary of the inner sub-coil (213') extends parallel to the cover in the regions extending beyond the RF coil (219) in the axial direction.

4. A coil system as claimed in claim 1, characterized in that in the regions extending beyond the RF coil (219) in the axial direction the distance between the inner sub-coil (213') and the axis (218) is larger than or equal to the distance between the RF coil (219) and the axis (218).

5. A coil system as claimed in claim 1, characterized in that the inner sub-coil (213') is symmetrical relative to a central plane (221) extending perpendicularly to the axis (218).

6. An MR apparatus which includes a coil system (210) for generating a uniform, steady magnetic field whose strength defines the Larmor frequency, and for generating RF pulses and for receiving MR signals generated in an object (215) to be examined, characterized in that the coil system (210) is constructed as disclosed in claim 1.

* * * * *